(12) United States Patent
Borden et al.

(10) Patent No.: US 8,168,462 B2
(45) Date of Patent: May 1, 2012

(54) PASSIVATION PROCESS FOR SOLAR CELL FABRICATION

(75) Inventors: Peter Borden, San Mateo, CA (US); Michael P. Stewart, Mountain View, CA (US); Li Xu, Santa Clara, CA (US); Hemant P. Mungekar, Campbell, CA (US); Christopher S. Olsen, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 112 days.

(21) Appl. No.: 12/479,139

(22) Filed: Jun. 5, 2009

(65) Prior Publication Data

US 2010/0311203 A1    Dec. 9, 2010

(51) Int. Cl.
*H01L 21/00*    (2006.01)
*H01L 31/0216*    (2006.01)

(52) U.S. Cl. .................... 438/57; 257/E31.119

(58) Field of Classification Search ............. 438/57, 438/98; 257/E31.119
See application file for complete search history.

(56) References Cited

U.S. PATENT DOCUMENTS

| | | | | |
|---|---|---|---|---|
| 6,541,370 | B1* | 4/2003 | Wang et al. | 438/624 |
| 7,816,188 | B2* | 10/2010 | Vyvoda et al. | 438/131 |
| 2007/0093013 | A1* | 4/2007 | Chua et al. | 438/197 |
| 2007/0137699 | A1* | 6/2007 | Manivannan et al. | 136/261 |
| 2008/0302653 | A1 | 12/2008 | Trassl et al. | |
| 2009/0061627 | A1 | 3/2009 | Trassl et al. | |
| 2009/0071535 | A1 | 3/2009 | Moeller et al. | |
| 2010/0015749 | A1* | 1/2010 | Borden | 438/72 |
| 2010/0029038 | A1* | 2/2010 | Murakawa | 438/97 |
| 2010/0084009 | A1* | 4/2010 | Carlson et al. | 136/255 |
| 2010/0267187 | A1* | 10/2010 | Funakoshi | 438/72 |

FOREIGN PATENT DOCUMENTS

WO    WO 2008062663 A1 *    5/2008

OTHER PUBLICATIONS

M. Lu, et al., "Rear Surface Passivation of Interdigitated Back Contact Silicon Heterojunction Solar Cell and 2D Simulation Study".
J. D. Moschner et al., "Comparison of Front and Back Surface Passivation Schemes for Silicon Solar Cells", Crystalline Silicon Solar Cells and Technologies, 2nd World Conference and Exhibition on Photovoltaic Solar Energy Conversion Jul. 6-10, 1998.
Lee, et al, "Rapid Thermal Processing of Silicon Solar Cells-Passivation and Diffusion", p. 87-106.
PCT international search report and written opinion of PCT/US2010/037395 dated Dec. 21, 2010.

(Continued)

*Primary Examiner* — William D Coleman
*Assistant Examiner* — Christine Enad
(74) *Attorney, Agent, or Firm* — Patterson & Sheridan, LLP

(57) ABSTRACT

Embodiments of the invention contemplate the formation of a high efficiency solar cell using a novel plasma oxidation process to form a passivation film stack on a surface of a solar cell substrate. In one embodiment, the methods include providing a substrate having a first type of doping atom on a back surface of the substrate and a second type of doping atom on a front surface of the substrate, plasma oxidizing the back surface of the substrate to form an oxidation layer thereon, and forming a silicon nitride layer on the oxidation layer.

19 Claims, 5 Drawing Sheets

OTHER PUBLICATIONS

Armin G. Aberle, "Surface Passivation of Crystalline Silicon Solar Cells: A Review", Progress in Photovoltaics: Research and Applications, vol. 8, Nov. 2, 2000, pp. 473-487. See p. 477, line 1, p. 484, line 13 and figure 3.

C. Leguijt et al., "Low temperature surface passivation for silicon solar cells", Solar Energy Materials and Solar Cells, vol. 40, Issue 4, Aug. 1, 1996, pp. 297-345. See p. 300, line 18, p. 304, line 28 and figure 1.

O. Scultz et al., "Silicon Oxide/Silicon Nitride Stack System for 20% Efficient Silicon Cells", In: Photovoltaic Specialists Conference 2005, Conference Record of the Thirty-first IEEE, Jan. 7, 2005, pp. 872-876. See p. 872, p. 876 and figure 6.

Ji Youn Lee et al., "Investigation of various surface passivation schemes for silicon solar cells", vol. 90, Issue 1, Jan. 6, 2006, pp. 82-92. See p. 83, line 19, p. 86, line 18 and figure 6.

* cited by examiner

PASSIVATION PROCESS FOR SOLAR CELL FABRICATION

BACKGROUND OF THE INVENTION

1. Field of the Invention

Embodiments of the invention generally relate to the fabrication of passivation layers of photovoltaic cells, more particularly, fabrication of passivation layers on a surface of photovoltaic cells.

2. Description of the Related Art

Solar cells are photovoltaic devices that convert sunlight directly into electrical power. The most common solar cell material is silicon, which is in the form of single or multicrystalline substrates, sometimes referred to as wafers. Because the amortized cost of forming silicon-based solar cells to generate electricity is higher than the cost of generating electricity using traditional methods, there has been an effort to reduce the cost required to form solar cells.

There are various approaches for fabricating the active regions and the current carrying metal lines, or conductors, of the solar cells. Manufacturing high efficiency solar cells at low cost is the key for making solar cells more competitive for the generation of electricity for mass consumption. The efficiency of solar cells is directly related to the ability of a cell to collect charges generated from absorbed photons in the various layers. A good passivation layer can provides a desired film property that reduces recombination of the electrons or holes in the solar cells and redirects electrons and charges back into the solar cells to generate photocurrent. When electrons and holes recombine, the incident solar energy is re-emitted as heat or light, thereby lowering the conversion efficiency of the solar cells.

Therefore, there exists a need for improved methods and apparatus to perform a passivation process on a surface of a substrate that improves conversion efficiency.

SUMMARY OF THE INVENTION

Embodiments of the invention contemplate the formation of a high efficiency solar cell using a novel plasma oxidation process to form a passivation film stack on a surface of a solar cell substrate. In one embodiment, a method of forming a passivation layer on a solar cell substrate includes providing a substrate having a first type of doping atom on a back surface of the substrate and a second type of doping atom on a front surface of the substrate, plasma oxidizing the back surface of the substrate to form an oxidation layer thereon, and forming a silicon nitride layer on the oxidation layer.

In another embodiment, a method of forming a passivation layer on a solar cell substrate includes providing a substrate comprising a first type of doping atom on a back surface of the substrate and a second type of doping atom on a front surface of the substrate, forming a negatively charged dielectric layer on the back surface of the substrate, and forming a back metal layer on the negatively charged dielectric layer, wherein the back metal layer is in electrical communication with the doping atoms formed in the substrate.

In yet another embodiment, a method of forming a passivation layer on a solar cell substrate includes providing a substrate comprising a first type of doping atom disposed therein, disposing a dopant material comprising a second type of doping atom on a front surface of the substrate, cleaning a back surface of the substrate, plasma oxidizing the back surface of the substrate to form an oxidation layer thereon, forming a silicon nitride layer on the oxidation layer on the back surface of the substrate, and depositing metal layer over the back surface of the substrate, wherein the metal layer is in electrical communication with the doping atoms formed in the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the invention contemplate the formation of a high efficiency solar cell using a method of forming a passivation layer on a surface of a solar cell. In one embodiment, the method utilizes a plasma process to form a passivation layer on a surface of a solar cell substrate. The plasma process may form an oxidation layer alone or in combination with other dielectric layers that form a composite passivation layer on a surface of a solar cell substrate. Solar cell substrates (e.g., substrate 110 in FIG. 1A) that may benefit from the invention include substrates that may have an active region that contains organic material, single crystal silicon, multicrystalline silicon, or polycrystalline silicon substrates that are used to convert sunlight to electrical power.

Figure 1A:
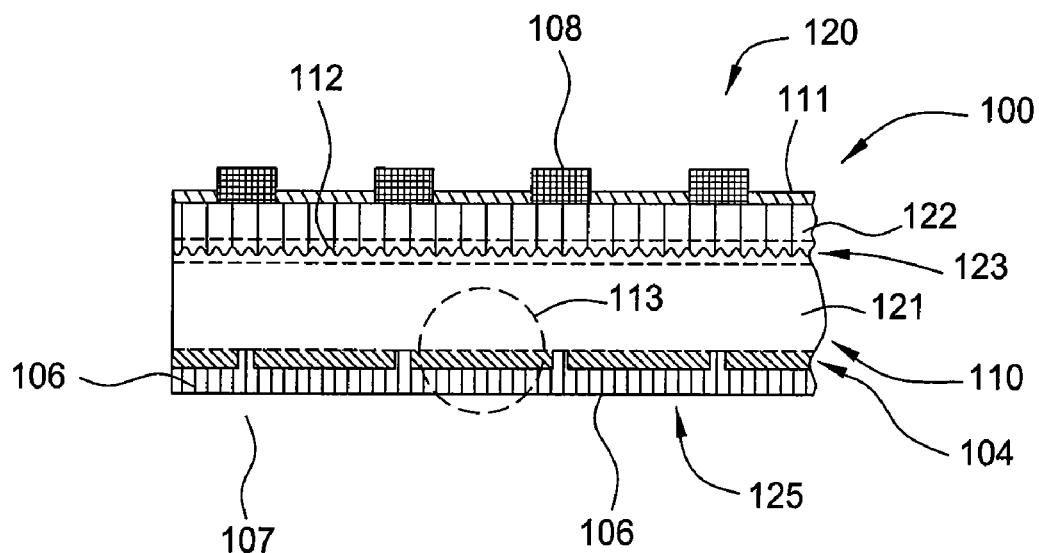
FIG. 1A depicts a schematic cross-sectional view of a solar cell having a passivation layer formed on a back surface of a substrate in accordance with one embodiment of the invention.

FIG. 1A depicts a cross sectional view of a crystalline silicon type solar cell substrate, or substrate 110 that may have a passivation layer 104 formed on a surface, e.g. a back surface 125, of the substrate 110. In the embodiment depicted in FIG. 1A, a silicon solar cell 100 is fabricated on the crystalline silicon type solar cell substrate 110 having a textured surface 112. The substrate 110 includes a p-type base region 121, an n-type emitter region 122, and a p-n junction region 123 disposed therebetween. The n-type emitter region 122 may be formed by doping a deposited semiconductor layer with certain types of elements (e.g., phosphorus (P), arsenic (As), or antimony (Sb)) in order to increase the number of negative charge carriers, i.e., electrons. In the exemplary embodiment depicted in FIG. 1A, the n-type emitter region 122 is formed by use of an amorphous, microcrystalline, nanocrystalline, or polycrystalline CVD deposition process that contains a dopant gas, such as a phosphorus containing gas (e.g., $PH_3$). In one embodiment, the p-n junction region 123 is formed between the p-type base region 121 and the n-type emitter region 122 to form a heterojunction type solar cell 100. In the formed solar cell 100, the electrical current generates when light strikes a front surface 120 of the substrate 110. The generated electrical current flows through metal front contacts 108 and a metal backside contact 106 formed on a back surface 125 of the substrate 110.

A composite passivation layer 104 may be disposed between the back contact 106 and the p-type base region 121 on the back surface 125 of the solar cell 100. The passivation layer 104 may be a dielectric layer providing a good interface property that reduces the recombination of the electrons and holes, drives and/or diffuses electrons and charge carriers back to the junction region 123, and minimizes light absorption. In one embodiment, the passivation layer 104 is disposed between the back contact 106 and the p-type base region 121 that allows a portion 107, e.g., fingers, of the back contact 106 extending through the passivation layer 104 to be in electrical contact/communication with the p-type base region 121. The front contacts 108 are generally configured as widely-spaced thin metal lines, or fingers, that supply current to larger buss bars transversely oriented relative to the fingers. The back contact 106 is generally not constrained to be formed in multiple thin metal lines, since it does not prevent incident light from striking the solar cell 100. However, a plurality of fingers 107 may be formed within the passivation layer 104 that are electrically connected to the back contact 106 to facilitate electrical flow between the back contact 106 and the p-type base region 121. Details regarding fabrication of the passivation layer 104 will be discussed below.

In one embodiment, the front contacts 108 and/or back contact 106 is a metal selected from a group consisting of aluminum (Al), silver (Ag), tin (Sn), cobalt (Co), nickel (Ni), zinc (Zn), lead (Pb), tungsten (W), titanium (Ti) and/or tantalum (Ta), nickel vanadium (NiV) or other similar materials. In one embodiment, the back contact 106 comprises aluminum (Al) material and nickel vanadium (NiV) material. In one embodiment, portion of the front contacts 108 and the back contact 106 are disposed on the surfaces 120, 125 of the substrate 110 using a screen printing process performed in a screen printing tool, which is available from Baccini S.p.A, a subsidiary of Applied Materials, Inc. In one embodiment, the front contacts 108 and the back contact 106 are heated in an oven to cause the deposited material to densify and form a desired electrical contact with the substrate surface 120, 125. The solar cell 100 may be covered with a thin layer of a dielectric material 111 to act as an anti-reflection coating (ARC) layer that minimizes light reflection from the top surface 120 of the solar cell 100. In one example, the dielectric material layer 111 functioning as the reflection coating (ARC) layer may be selected from a group consisting of silicon nitride ($Si_3N_4$), silicon nitride hydride (SixNy:H), silicon oxide, silicon oxynitride, a composite film of silicon oxide and silicon nitride, and the like. An example of formed solar cell device that can benefit from the process described herein is further described in the commonly assigned U.S. Provisional Patent Application Ser. No. 61/048,001, filed Jul. 16, 2009, U.S. Provisional Patent Application Ser. No. 61/139,423, filed Dec. 19, 2008, and U.S. Provisional Patent Application Ser. No. 61/043,664, filed Apr. 9, 2008, which are all incorporated by reference in their entireties.

Figure 1B:
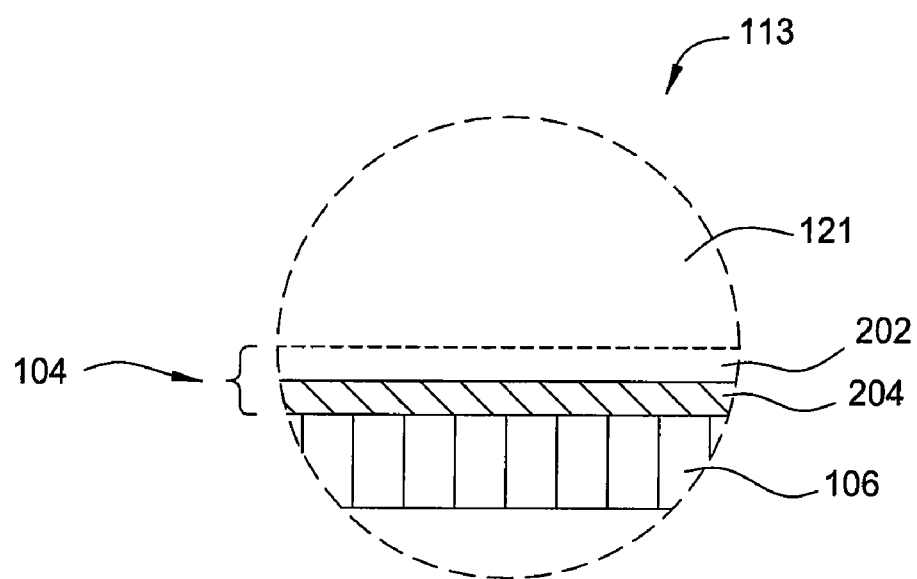
FIG. 1B depicts a enlarged view of the passivation layer disposed on the substrate of FIG. 1.

FIG. 1B depicts an enlarged view of the composite passivation layer 104 disposed between the back contact 106 and the p-type base region 121. The passivation layer 104 includes a film stack having a first passivation layer 202 and a second passivation layer 204. It is believed that utilizing multiple passivation layers, i.e. greater than two layers, can provide better passivation than a single layer for solar cell applications. Furthermore, high quality passivation withstands heat treatment associated with the subsequent firing of screen-printed contacts process at the end of the production line without damage or contaminating the solar cells 100 formed therethrough.

In one embodiment, the first passivation layer 202 formed in contact with the p-type base region 121 is an oxidation layer formed from the p-type base region 121. The second passivation layer 204 may be a silicon nitride or silicon oxynitride layer formed on the first passivation layer 202. The first passivation layer 202 may be formed by plasma oxidizing the back surface 125 of the p-type base region 121, thereby incorporating oxygen elements into the back surface 125 of the p-type base region 121 to form the oxidation layer. The silicon nitride or silicon oxynitride layer for the second passivation layer 204 may be formed from any suitable deposition techniques. Details about how the first passivation layer 202 and the second passivation layer 204 may be formed on the p-type base region 121 will be further discussed below with referenced to FIGS. 5-6.

In one embodiment, the passivation layer 104 is configured to be a negatively charged film. In the exemplary embodiment depicted in FIG. 2A, as the passivation layer 104 is configured to be a negatively charged film, the passivation layer 104 repels electrons, which are minority carriers in the p-type base region 121. The electrons 302 are repelled and driven to a direction 304 away from the passivation layer 104 and toward the junction region 123. Accordingly, as the electrons 304 are driven toward to the junction region 123, the electrons are likely to be collected again at the junction regions 123, thereby enhancing and improving photocurrent. Furthermore, the negative charges (e.g., electrons) may be accumulated at the interface between the passivation layer 104 and the p-type base region 121, thereby providing improved passivation under operation conditions.

Figure 2A:
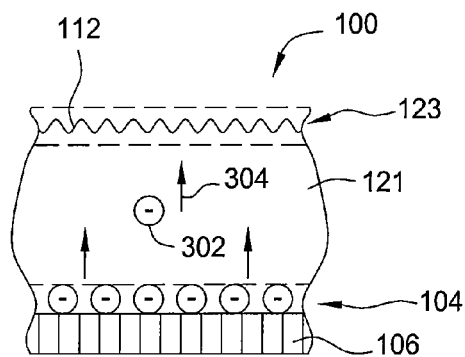
FIGS. 2A-2B depicts a schematic cross-sectional view of electron flow direction in a solar cell having different charges of a passivation layer formed thereon.
Figure 2B:
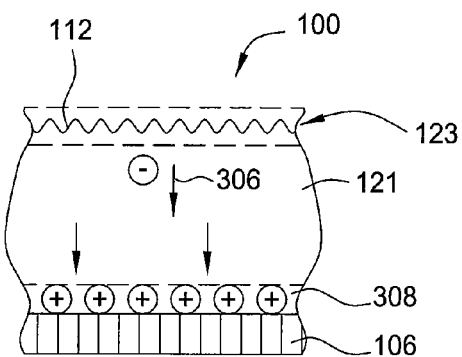

In contrast, in the case that the passivation layer 308 is a positively charged film, as shown in FIG. 2B, the positive charges in the passivation layer 308 will attract electrons in a direction 306 toward the passivation layer 308 and away from the junction region 123. As such, the passivation layer 308 of FIG. 2B would tend to drive electrons away from the junction region 123 to the rear surface of the substrate, thereby reducing the photocurrent generated in the solar cell. Furthermore, when the back surface of the substrate is inverted, the inversion layer may quickly drain off when current flows, leaving a depletion layer, resulting in poor passivation when photon-energy collecting operation. Accordingly, a negatively charged film, as depicted in FIG. 2A, exhibits electrical properties which are advantageous when configured as the passivation layer 104. Charge of the passivation layer 104 may be measured by a capacitance-voltage (CV) system to determine if the passivation layer 104 is a negatively charged or positively charged film.

Figure 3:
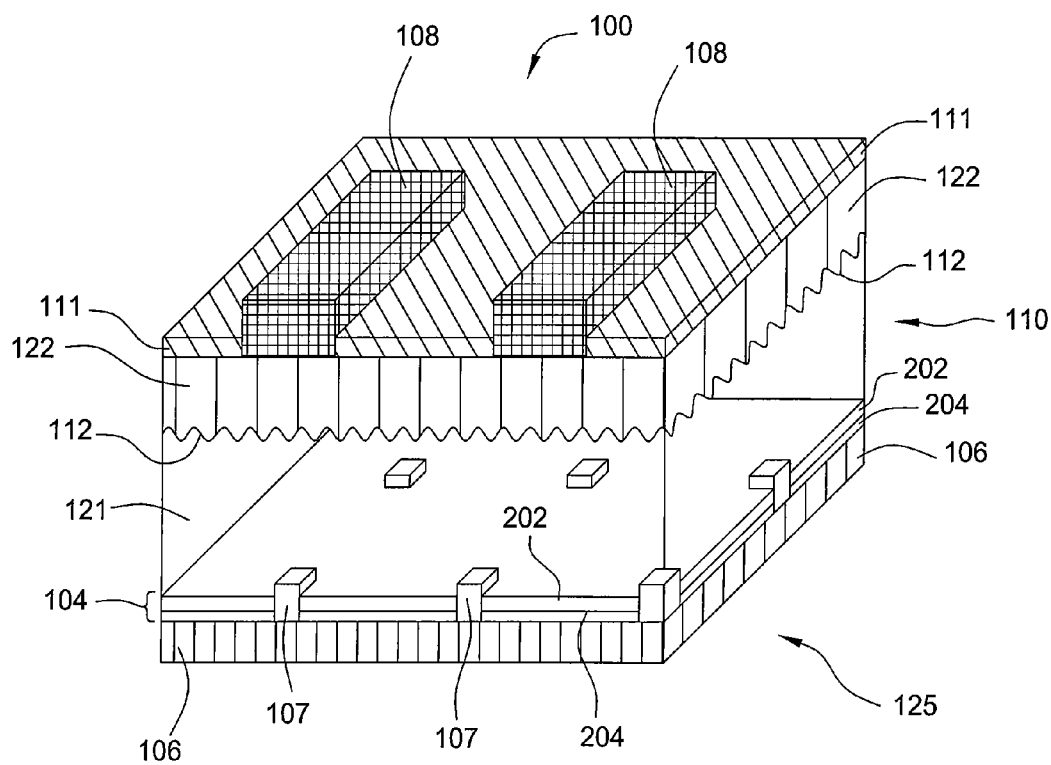
FIG. 3 depicts an isometric view of a solar cell having a passivation layer formed on a back surface of a substrate.

FIG. 3 depicts an isometric view of the solar cell 100 having the negatively charged passivation layer 104 formed on the back surface 125 of the substrate 110. The passivation layer 104, including the first passivation layer 202 and the second passivation layer 204, are disposed between the p-type base region 121 and the back contact 106. The metal contact fingers 107 may be in form of posts extending from the back contact 106 through the passivation layer 104 to be in electrical contact with the p-type base region 121. Alternatively, the metal contact fingers 107 may be in other suitable forms, such as metal lines, to maintain the desired electrical communications between the back contact 106 and the p-type base region 121.

Figure 4:
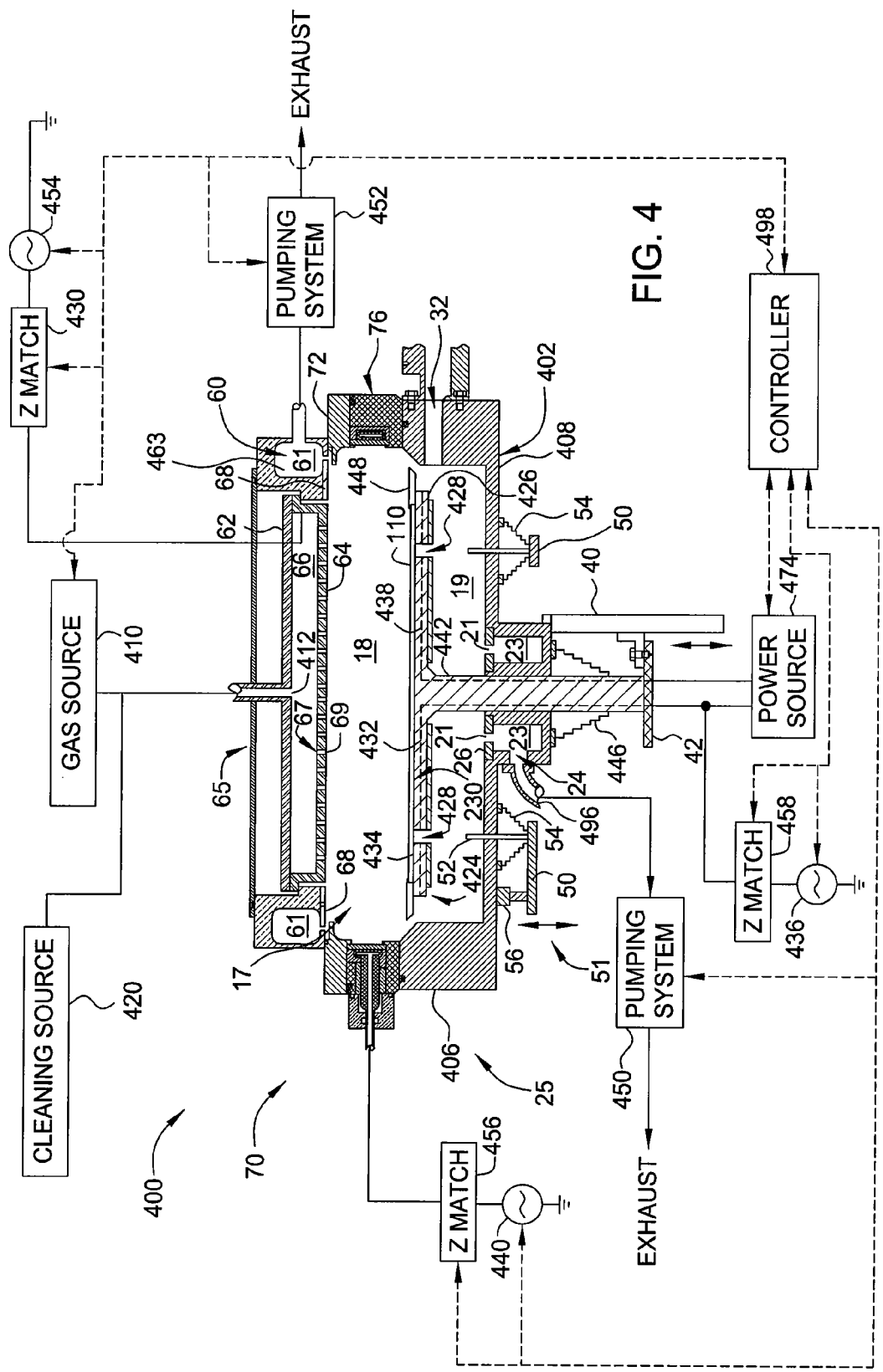
FIG. 4 depicts a schematic cross-sectional view of one embodiment of a process chamber that may be utilized to form a passivation layer in accordance with the invention.

FIG. 4 is a schematic cross-sectional view of a plasma processing chamber 400 that may be utilized to form the passivation layer 104. The plasma processing chamber 400 generally includes a gas distribution assembly 64, a lid assembly 65, an inductively coupled source assembly 70, and a lower chamber assembly 25. A chamber volume 17, which is made up of an process volume 18 and a lower volume 19, defines a region in which the plasma processing will occur in the plasma processing chamber 400 and is substantially enclosed by the gas distribution assembly 64, the inductively coupled source assembly 70, and the lower chamber assembly 25.

The lower chamber assembly 25 generally includes a substrate lift assembly 51, a substrate support 438 and a processing chamber base 402. The processing chamber base 402 has chamber walls 406 and a chamber bottom 408 that partially bond the lower volume 19. The substrate support 438 is accessed through an access port 32 formed through the chamber walls 406. The access port 32 defines an aperture through which a substrate, such as the substrate 110, can be moved in and out of the processing chamber base 402. The chamber walls 406 and chamber bottom 408 may be fabricated from a unitary block of aluminum or other material(s) compatible with processing conditions.

The substrate support 438 is temperature controlled and is connected to the processing chamber base 402. The substrate support 438 supports the substrate 110 during processing. In one embodiment, the substrate support 438 comprises an aluminum body 424 that encapsulates at least one embedded heater 432. The embedded heater 432 may be a resistive heating element or other suitable heating elements. The embedded heater 432 is coupled to a power source 474, which can controllably heat the substrate support 438 and the substrate 110 positioned thereon to a predetermined temperature by use of a controller 498. In one embodiment, the embedded heater 432 maintains the substrate 110 at a uniform temperature range between about 60° C. for plastic substrates to about 550° C. for glass substrates.

Generally, the substrate support 438 has a back side 426, a front side 434 and a stem 442. The front side 434 supports the substrate 110, while the stem 442 is coupled to the back side 426. A stem base 42 is attached to the stem 442 and is connected to a lift assembly 40 that controls the elevation of the substrate support 438 within the chamber volume 17. The stem 442 additionally provides a conduit for electrical and thermocouple leads between the substrate support 438 and other components. The lift assembly 40 may comprise a pneumatic or motorized lead-screw type lift assembly commonly used in the art to supply the force necessary to accurately position the support assembly in the plasma processing chamber 400.

A bellows 446 is coupled between substrate support 438 (or the stem 442) and the chamber bottom 408 of the processing chamber base 402. The bellows 446 provides a vacuum seal between the chamber volume 17 and the atmosphere outside the processing chamber base 402, while facilitating vertical movement of the substrate support 438.

The substrate support 438 additionally supports a shadow frame 448 which circumscribes the substrate 110. Generally, the shadow frame 448 prevents deposition on the edge of the substrate 110 and on perimeter of the substrate support 438. In one embodiment, the shadow frame 448 is disposed on a capturing feature (not shown), which is mounted in the plasma processing chamber 400, as the substrate support 438 is lowered from the processing position 18, to allow the substrate support 438 to separate from the shadow frame 448 as it rests on the capture feature.

The substrate support 438 has a plurality of holes 428 disposed therethrough to accept a plurality of lift pins 52. The lift pins 52 may be made from ceramic, graphite, ceramic coated metal, or stainless steel. The lift pins 52 may be actuated relative to the substrate support 438 and process chamber base 402 by the lift plate assembly 51. The lift assembly 51 includes a lift plate 50 and lift actuator 56. The lift plate 50 is displaced at the lift actuator 56 to move the lift pins 52 between retracted and raised positions. Lift bellows 54, attached to each of the lift pins 52 and the chamber bottom 408, are used to isolate the lower volume 19 from the atmosphere outside of the plasma process chamber 400, while also allowing the lift pins 52 to move between the retracted and the raised positions. When the lift pins 52 are in the raised position and the substrate support 438 is in a transfer position, the substrate 110 is lifted above the top edge of the access port 32 so that the system robot can enter and exit from the plasma processing chamber 400 to facilitate substrate transfer between the robot and the substrate support 438.

The lid assembly 65 typically includes an entry port 412 through which process gases, provided by the gas source 410, are introduced into the process volume 18 after passing through the gas distribution plate 64. Proper control and regulation of the gas flows from the gas source 410 to the entry port 412 are performed by mass flow controllers (not shown) and the controller 498. The gas source 410 may include a plurality of mass flow controllers (not shown). The term "mass flow controllers", as used herein, refers to any control valves capable of providing rapid and precise gas flow to the plasma processing chamber 400. The entry port 412 allows process gases to be introduced and uniformly distributed in the plasma processing chamber 400. Additionally, the entry port 412 may optionally be heated to prevent condensation of any reactive gases within the manifold.

The entry port 412 is also coupled to a cleaning source 420. The cleaning source 420 typically provides a cleaning agent, such as disassociated fluorine, that is introduced into the process volume 18 to remove deposition by-products and stray deposited material left over after the completion of prior processing steps.

The lid assembly 65 provides an upper boundary to the process volume 18. The lid assembly 65 typically can be removed from the chamber base 402 and/or the inductively coupled source assembly 70 to service components in the plasma processing chamber 400. Typically, the lid assembly 65 is fabricated from aluminum (Al) or an anodized aluminum body.

In one embodiment, the lid assembly 65 includes a pumping plenum 463 which is coupled to an external vacuum pumping system 452. The pumping plenum 463 is utilized to uniformly evacuate the gases and processing by-products from the process volume 18. The pumping plenum 463 is generally formed within, or attached to, the chamber lid 60 and covered by a plate 68 to form the pumping channel 61. To assure uniform evacuation of the process volume 18 a gap is formed between the plate 68 and chamber lid 60, to create a small restriction to gas flowing into the pumping channel 61. A vacuum pumping system 152 is coupled to the pumping channel and generally includes a vacuum pump which may be a turbo pump, rough pump, and/or Roots Blower™, as required to achieve the desired chamber processing pressures.

Alternatively, a pumping plenum 24, found in the lower chamber assembly 25, is used to uniformly evacuate the gases and processing by-products from the process volume 18 by use of a vacuum pumping system 450. The pumping plenum 24 is formed within, or attached to the chamber bottom 408, and may be covered by a plate 26 to form a enclosed pumping channel 23. The plate 26 generally contains a plurality of holes 21 (or slots) to create a small restriction to gas flowing into the pumping channel 23 to promote uniform evacuation of the chamber volume 17. The pumping channel 23 is connected to the vacuum pumping system 450 through a pumping port 496. The vacuum pumping system 450 generally includes a vacuum pump, which may be a turbo pump, rough pump, and/or Roots Blower™, as required to achieve the desired chamber processing pressures.

In another embodiment, both pumping plenum 24 and the pumping plenum 463 may be used to evacuate the process volume 18. In this embodiment, the relative flow rate of gas removed from the process volume 18, by use of vacuum pumping system 152, and from the lower volume 19, by use of vacuum pumping system 150, may be optimized to improve plasma processing results and reduce the leakage of the plasma and processing by-products into the lower volume 19. Reducing the leakage of the plasma and processing by-products will reduce the amount of stray deposition on the lower chamber assembly components, and thus, reduce the clean time and/or the frequency of using the cleaning source 420 to remove unwanted deposits from the lower assembly 25.

The gas distribution plate 64 is coupled to a top plate 62 of the lid assembly 65. The gas distribution plate 64 includes a perforated area 67, through which process and other gases supplied from the gas source 410 are delivered to the process volume 18. Gas distribution plates that may be adapted to benefit from the invention are described in commonly assigned U.S. patent application Ser. No. 10/337,483, filed Jan. 7, 2003 by Blonigan et al.; U.S. Pat. No. 6,477,980, issued Nov. 12, 2002 to White et al.; and U.S. patent application Ser. Nos. 10/417,592, filed Apr. 16, 2003 by Choi et al., which are hereby incorporated by reference in their entireties.

The gas distribution plate 64 may be formed from a single unitary member. In other embodiments the gas distribution plate 64 can be made from two or more separate pieces. A plurality of gas passages 69 are formed through the gas distribution plate 64 to allow a desired distribution of the process gases to pass through the gas distribution plate 64 and into the process volume 18. A plenum 66 is formed between the gas distribution plate 64 and the top plate 62. The plenum 66 allows gases flowing into the plenum 66 from the entry port 412 to uniformly distribute across the width of the gas distribution plate 64 and flow uniformly through the gas passages 69. The gas distribution plate 64 is typically fabricated from aluminum (Al), anodized aluminum, or other RF conductive material. The gas distribution plate 64 is electrically isolated from the chamber lid 60 by an electrical insulation piece (note shown).

In one embodiment, the gas distribution plate 64 is RF biased so that a plasma generated in the process volume 18 can be controlled and shaped by use of an attached impedance match element 454, an RF power source 454 and the controller 498. The RF biased gas distribution plate 64 acts as a capacitively coupled RF energy transmitting device that can generate and control the plasma in the process volume 18.

Additionally, an RF power source 436 may apply RF bias power to the substrate support 438 through an impedance match element 434. By use of the RF power source 436, the impedance match element 458 and the controller 498, the control of the generated plasma in the process volume 18, plasma bombardment of the substrate 110 and plasma sheath thickness over the substrate surface may be controlled. In another embodiment, the RF power source 436 and the impedance match element 458 may be replaced by one or more connections to ground (not shown) thus grounding the substrate support 438.

Furthermore, a RF power source 440 may be coupled to the inductively coupled source assembly 70 through an RF impedance match networks 456. A coil (not shown) is disposed in the inductively coupled source assembly 70 and serves as an inductively coupled RF energy transmitting device that can generate and control the plasma generated in the process volume 18.

The controller 498 is adapted to control substantially all aspects of the complete substrate processing sequence. The controller 498 may be adapted to control the impedance match elements (i.e., 458, 456, and 454), the RF power sources (i.e., 436, 430 and 440) and other elements of the plasma processing chamber 400. The plasma processing variables of the processing chamber 400 may be controlled by the controller 498, which may be a microprocessor-based controller. The controller 498 is configured to receive inputs from a user and/or various sensors in the plasma processing chamber and appropriately control the plasma processing chamber components in accordance with the various inputs and software instructions retained in the controller's memory. The controller 498 generally includes memory and a CPU which are utilized by the controller to retain various programs, process the programs, and execute the programs when necessary. The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like all well known in the art. A program (or computer instructions) readable by the controller 498 determines which tasks are performable in the plasma processing chamber. Preferably, the program is software readable by the controller 498 and includes instructions to monitor and control the plasma process based on defined rules and input data.

Figure 5:
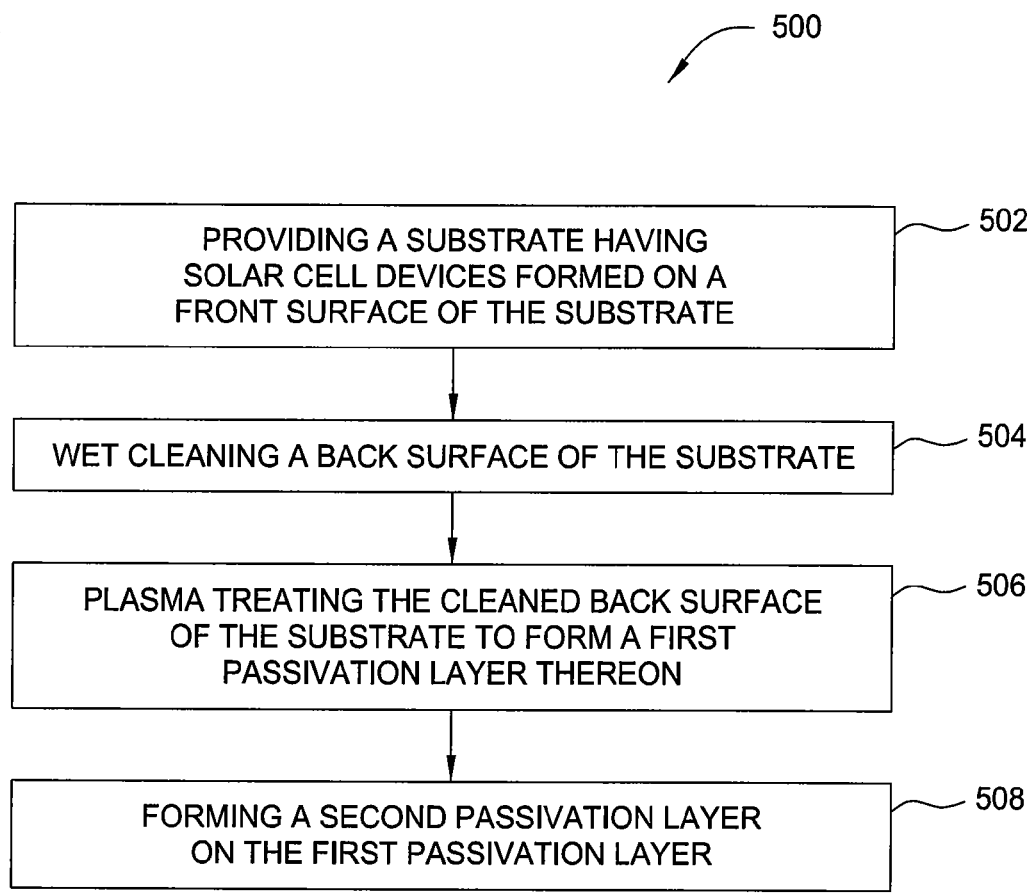
FIG. 5 depicts a flow chart of a method to form a passivation layer of a solar cell according to embodiments of the invention.

FIG. 5 depicts a flow diagram of one embodiment of a process 500 that may be practiced in the processing chamber 400, as described in FIG. 4, or other suitable processing chamber, to form the passivation layer 104. FIGS. 6A-6D are schematic cross-sectional views of a portion of the solar cell 100 corresponding to various stages of the process 500. The process 500 described with connection to FIG. 6A-6D may be beneficially utilized to fabricate the passivation layer 104 in solar cells. However, it is contemplated that the process 500 may be adapted to perform in any other suitable processing reactors, including those from other manufacturers and/or to form different devices. It should be noted that the number and sequence of steps illustrated in FIG. 5 are not intended to limiting as to the scope of the invention described herein, since one or more steps can be added, deleted and/or reordered were appropriate without deviating from the basic scope of the invention described herein.

Figure 6A:
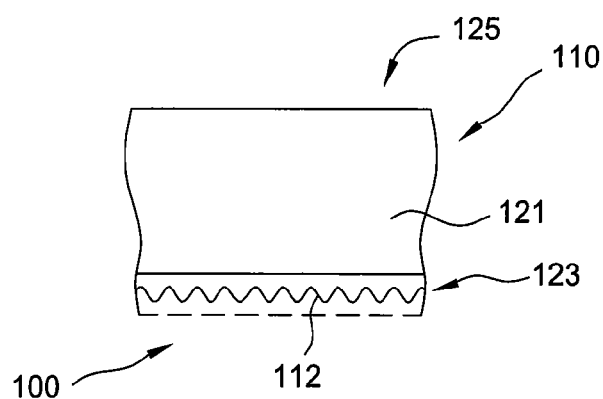
FIGS. 6A-6D depict sequential cross-sectional views of a solar cell to form a passivation layer thereon according to the method of FIG. 5.

The process 500 begins at step 502 by providing the substrate 110 having solar cell devices 100 disposed thereon, as shown in FIG. 6A. The solar cell 100 formed on the substrate 110 has been discussed above with referenced to FIG. 1 and the description here is eliminated for sake of brevity. The substrate 110 depicted in FIGS. 6A-6D is shown up side down to facilitate description of forming the passivation layer 104 on the back surface 125 of the substrate 110.

Figure 6B:
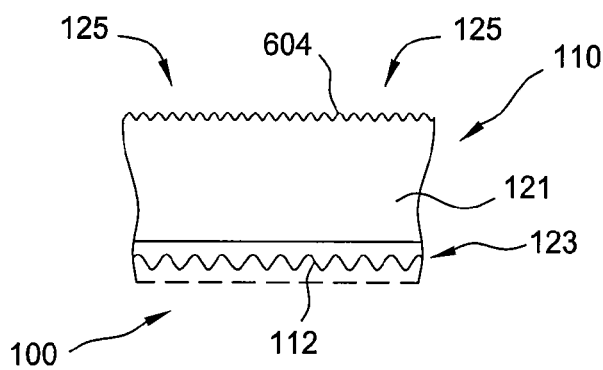

At step 504, the back surfaces 125 of the p-type base region 121 of the substrate 110 are cleaned to remove any undesirable material and form a roughened surface 604, as shown in FIG. 6B. It is noted that the front surface 120 (shown in FIG. 1) may also be cleaned as needed. In one embodiment, the clean process may be performed using a batch cleaning process in which the substrates are exposed to a cleaning solution. In one embodiment, the substrates are wetted by spraying, flooding, immersing of other suitable technique. The clean solution may be an SC1 cleaning solution, an SC2 cleaning solution, HF-last type cleaning solution, ozonated water solution, hydrofluoric acid (HF) and hydrogen peroxide ($H_2O_2$) solution, or other suitable cleaning solution. In one embodiment, the surface 125 of the substrate 110 is cleaned by hydrogen fluoride or hydrofluoric acid. The cleaning process may be performed on the substrate for a duration of between about 5 seconds and about 600 seconds, such as about 30 seconds to about 240 second, for example about 120 seconds.

Figure 6C:
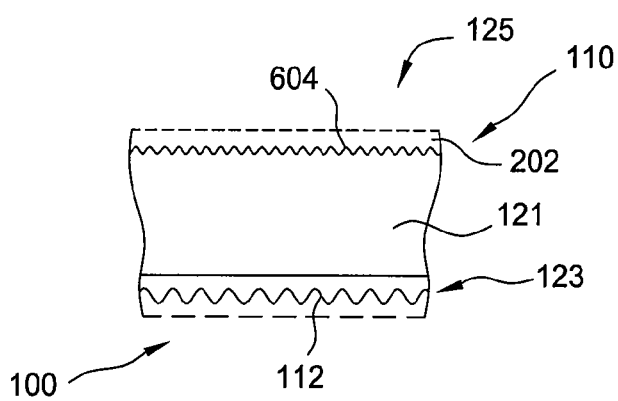

At step 506, an oxidation plasma process is performed on the roughened surface 604 of the substrate 110 to form the first passivation layer 202, as shown in FIG. 6C. The oxidation plasma process may be performed in a plasma processing reactor, such as the processing chamber 400 of FIG. 4. The plasma oxidation process may be a decoupled plasma oxidation process (DPO) performed by forming a plasma from an oxygen containing gas mixture to plasma treat the roughened surface 604 of the substrate 110. As the p-type base region 121 is a silicon based layer having p-type dopants formed therein, the roughened surface 604 is mostly composed by the silicon atoms. When the oxygen containing gas mixture is plasma dissociated, the oxygen atoms are accumulated and absorbed on the silicon roughened surface 604, forming an oxidation layer as the first passivation layer 202 on the roughened surface 604. The plasma oxidation process provides energetic oxygen atoms to react with the silicon atoms on the roughened surface 604, forming an oxygen rich oxidation layer 202 on the roughened surface 604. The oxidation plasma process may be performed at temperature range selected to prevent solar cell 100 from heat damage, such as at a temperature less than about 600 degrees Celsius. Unlike conventional high temperature process, e.g., greater than 800 degrees Celsius, the low temperature plasma oxidation process can form the oxidization layer on the substrate without adversely impact the film properties and existing device performance formed on the substrate 110. In one embodiment, the plasma oxidation process may be performed at a temperature less than about 600 degrees Celsius, such as between about 10 degrees Celsius and about 500 degrees Celsius, or between about 100 degrees Celsius and about 400 degrees Celsius. In one embodiment, the oxidation layer 202 may have a thickness less than about 300 Å, such as less than 150 Å, such as about 5 Å and about 65 Å.

In one embodiment, the gas mixture supplied to perform the plasma oxidation process may include at least one oxygen containing gas, and optionally a nitrogen containing gas, an inert gas, or other suitable gas. Examples of the oxygen containing gas include $O_2$, $N_2O$, $NO_2$, $NO$, $O_3$, $H_2O$, and the like. Examples of the nitrogen containing gas include $N_2$, $NH_3$, $N_2O$, $NO_2$, $NO$ and the like. Examples of the inert gas include Ar or He. In the embodiment wherein the plasma oxidation process is performed to form an oxidation layer on the roughened surface 604, the gas mixture may include at least an oxygen containing gas. In another embodiment wherein the plasma oxidation process is performed to form an oxynitride layer on the textured surface 604, the gas mixture may include at least a nitrogen containing gas, and/or an oxygen containing layer. Alternatively, the inert gas may be supplied with the oxygen containing gas, nitrogen containing gas, or combination thereof in the gas mixture. In an exemplary embodiment depicted herein, the oxygen containing gas supplied in the gas mixture is $N_2O$, or $O_2$ to form the oxidation layer or oxynitride layer.

In one embodiment, the plasma oxidation process at step 506 may be performed for a duration of about 10 seconds to about 300 seconds, for example, from about 30 seconds to about 240 seconds, and in one embodiment, from about 60 seconds to about 180 seconds. Also, the plasma oxidation process may be conducted at a plasma power, such as an inductive RF power at 13.56 MHz, setting from about 500 Watts to about 4,500 Watts, for example, from about 700 Watts to about 3,500 Watts, or about 2400 Watts. The plasma process is conducted with a duty cycle of about 2 percent to about 50 percent, or at 100 percent duty as continuous cycles and at a pulse frequency at about 10 kHz. In one embodiment, the RF power is pulsed at a duty cycle of about 5 percent. In another embodiment, the RF power is pulsed at about 5 percent duty cycle at a set point of about 800 Watts, resulting in an effective power of about 40 Watts effective plasma excitation power. Alternatively, the plasma power may be provided by other plasma source, including planar microwave plasma sources, or other suitable sources utilized for practice the present invention. The DPO chamber may have a pressure from about 0 mTorr to about 5000 mTorr. The inert gas may have a flow rate from about 20 standard cubic centimeters per minute (sccm) to about 200 standard liters per minute (slm), or from about 12000 sccm to about 15000 sccm, or from about 500 sccm to about 700 sccm.

Figure 6D:
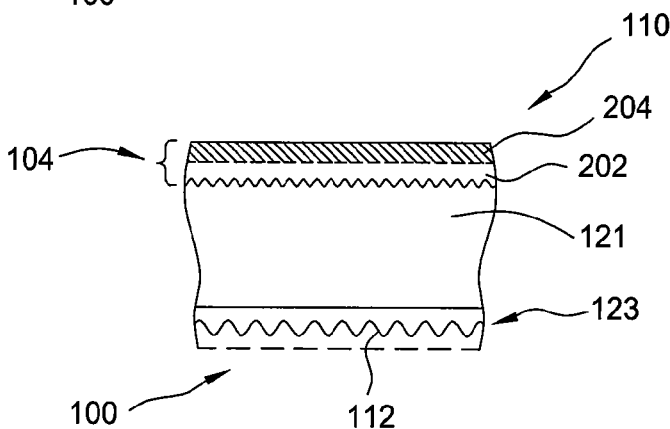

At step 508, after formation of the first passivation layer 202, the second passivation layer 204 may be formed on the first passivation layer 202 to form the stack comprising the passivation layer 104, as shown in FIG. 6D. The second passivation layer 204 may be formed at the same processing chamber, such as the processing chamber 400 of FIG. 4, for ease of operation. Alternatively, the second passivation layer 204 may be formed at separate processing chambers as needed. In one embodiment, the second passivation layer 204 may be a silicon nitride ($Si_3N_4$) layer or silicon nitride hydride (SixNy:H) layer formed by a suitable deposition technique, such as chemical vapor deposition (CVD), physical vapor deposition (PVD), or the like. Furthermore, the silicon nitride layer of the second passivation layer 204 may also serve as an ARC layer that minimizes light reflection from the back surface 125 of the solar cell 100.

In the embodiment wherein the first passivation layer 202 and the second passivation layer 204 are formed in the same processing chamber, such as the processing chamber 400 of FIG. 4, after supplying the oxygen containing gas mixture at step 506 to form the first passivation layer 202, a nitrogen containing gas mixture including a silicon based gas may be subsequently supplied into the processing chamber to form the second passivation layer 204. In the embodiment wherein the second passivation layer 204 is configured to be formed as the silicon nitride ($Si_3N_4$) layer or silicon nitride hydride (SixNy:H) layer over the first passivation layer 202, the gas mixture may be switched from the oxygen containing gas, such as $N_2O$, $NO_2$ or $O_2$, to the nitrogen containing gas, such as $NH_3$ or $N_2$, supplied with a silicon based gas. Suitable examples of the silicon based gas includes include SiH$_4$, Si$_2$H$_6$, and the like. The nitrogen containing gas along with the silicon based gas are plasma dissociated in the processing chamber, forming the second passivation layer of the silicon nitride (Si$_3$N$_4$) layer or silicon nitride hydride (SixNy:H) layer over the passivation layer 202 with a desired film thickness. In one embodiment, the silicon nitride (Si$_3$N$_4$) layer 204 has a film thickness between about 600 Å and about 750 Å.

Several process parameters may be regulated at step 508 while forming the second passivation layer 204. In one embodiment, the processing pressure may be regulated between about 0.5 Torr and about 5 Torr, for example, between about 1.2 Torr and about 1.8 Torr. The substrate temperature is maintained between about 300 degrees Celsius and about 500 degrees Celsius. The spacing may be controlled between about 550 mils and about 1200 mils. The gas flow of nitrogen containing gas, such as NH$_3$, NO$_2$ or N$_2$, is provided to the chamber at a flow rate between about 500 sccm to about 2800 sccm, for example, about 2000 sccm to about 2200 sccm. The silicon based gas, such as saline (SiH$_4$) gas, is provided to the chamber at a flow rate between about 400 sccm to about 900 sccm, for example, about 700 sccm to about 800 sccm. An inert gas may be optionally supplied in the gas mixture. The gas flow of inert gas, such as Ar or He, is flowed into the chamber at a rate between about 0 sccm to about 100 sccm, for example, about 50 sccm to about 60 sccm.

By utilizing a plasma deposition process to form the passivation layer 104 as a film stack 104 that includes the first passivation layer 202 and the second passivation layer 204, a negatively charged film may be obtained. It is believed by the plasma process, instead of a thermal process as conventionally performed in the art, can assist maintaining the end-resultant plasma deposited film as a compressive film carrying negative charges thereon. As discussed above, negatively charged passivation film can assist repelling electrons back to the junction region, thereby enhancing and improving photocurrent and solar cell conversion efficiency. Therefore, the plasma oxidation process of the first passivation layer 202 and the plasma deposition process of the second passivation layer 204 in combination assist providing good passivation film property that improves the electrical performance of a solar cell.

Optionally, after formation of the composite passivation layer 104, the substrate 110 may be thermally annealed to a temperature between about 600 degrees Celsius and about 1,000 degrees Celsius, such as about 750 degrees Celsius, or about 1 second to about 180 seconds, for example, about 2 seconds to about 60 seconds, such as about 5 seconds to about 100 seconds. The annealing process may be performed in a suitable annealing process chamber. At least one annealing gas is supplied into the annealing chamber for thermal annealing process. Examples of annealing gases include oxygen (O$_2$), ozone (O$_3$), atomic oxygen (O), water (H$_2$O), nitric oxide (NO), nitrous oxide (N$_2$O), nitrogen dioxide (NO$_2$), dinitrogen pentoxide (N$_2$O$_5$), nitrogen (N$_2$), ammonia (NH$_3$), hydrazine (N$_2$H$_4$), Ar, He, derivatives thereof or combinations thereof. In one example of a thermal annealing process, the substrate 110 is annealed to a temperature of about 750 degrees Celsius for about 5 seconds within a 5% hydrogen in nitrogen atmosphere. It is believed that the thermal annealing process may assist repairing and reconstructing the atomic lattices of the composite passivation layer 104. The thermal annealing process also drives out the dangling bond and reconstruct the film bonding structure, thereby reducing film leakage and promoting the film qualities and overall device performance.

After formation of the composite passivation layer 104, the substrate 110 may be further transferred to do the subsequent end of the process line process, such as for the deposition of back contact 106, as depicted in FIG. 1, and firing process to complete the solar cell fabrication process.

Alternatively, the composite passivation layer 104 may also be formed as the ARC layer, such as the ARC layer 111, formed on the front side 120 of the substrate 110, as depicted in FIG. 1, as needed.

Thus, the present application provides methods for forming passivation film stack on a surface of a solar cell. The methods advantageously a passivation film stack that assists enhancing photocurrent generated in the solar junction cell, thereby improving the overall solar cell conversion efficiency and electrical performance.

While the foregoing is directed to embodiments of the present invention, other and further embodiments of the invention may be devised without departing from the basic scope thereof, and the scope thereof is determined by the claims that follow.

What is claimed is:

1. A method of forming a composite passivation layer on a solar cell substrate, comprising:
    providing a substrate having a p-type of doping atom on a back surface of the substrate and a n-type of doping atom on a front surface of the substrate forming a p-n junction region therebetween, wherein the substrate comprises a p-type substrate;
    plasma oxidizing the back surface of the substrate by a decoupled plasma oxidation process formed from a first gas mixture including an oxygen containing gas or a nitrogen containing gas at a process temperature less than 600 degrees Celsius to form an oxidation layer thereon;
    switching the first gas mixture to a second gas mixture including a silicon containing gas and a nitrogen containing gas; and
    forming a silicon nitride layer on the oxidation layer while maintaining the process temperature between about 300 degrees Celsius and about 500 degrees Celsius, wherein the oxidation layer and the silicon nitride layer are formed on the substrate in-situ in a single chamber.

2. A method of forming a passivation layer on a solar cell substrate, comprising:
    providing a substrate comprising a p-type of doping atom on a back surface of the substrate and a n-type of doping atom on a front surface of the substrate forming a p-n junction region therebetween, wherein the substrate comprises a p-type substrate;
    forming a negatively charged dielectric layer on the back surface of the substrate, wherein the negatively charged dielectric layer is formed by plasma oxidizing the back surface of the substrate by a decoupled plasma oxidation process at a process temperature less than 600 degrees Celsius to form an oxidation layer and subsequently forming a silicon nitride layer on the oxidation layer in a single processing chamber, wherein the oxidation layer and the silicon nitride layer is formed by switching from a first gas mixture including an oxygen containing gas or a nitrogen containing gas to a second gas mixture including at least a silicon containing gas and a nitrogen containing gas to form the oxidation layer and the silicon nitride layer respectively; and
    forming a back metal layer on the negatively charged dielectric layer, wherein the back metal layer is in electrical communication with the doping atoms formed in the substrate.

3. A method of forming a passivation layer on a solar cell substrate, comprising:
   providing a substrate comprising a p-type of doping atom disposed therein;
   disposing a dopant material comprising a n-type of doping atom on a front surface of the substrate forming a p-n junction region therebetween, wherein the substrate comprises a p-type substrate;
   cleaning a back surface of the substrate;
   plasma oxidizing the back surface of the substrate by a decoupled plasma oxidation process formed from a first gas mixture including an oxygen containing gas or a nitrogen containing gas at a process temperature less than 600 degrees Celsius to form an oxidation layer thereon;
   switching the first gas mixture to a second gas mixture including a silicon containing gas and a nitrogen containing gas while maintaining the process temperature between about 300 degrees Celsius and about 500 degrees Celsius;
   forming a silicon nitride layer on the oxidation layer on the back surface of the substrate, wherein the oxidation layer and the silicon nitride layer are formed on the substrate in-situ in a single chamber; and
   depositing metal layer over the back surface of the substrate, wherein the metal layer is in electrical communication with the doping atoms formed in the substrate.

4. The method of claim 1, wherein the p-type of doping atom is boron.

5. The method of claim 1, wherein the oxygen containing gas in the first gas mixture is selected from a group consisting of $O_2$, $N_2O$, $NO_2$, $O_3$, or $H_2O$.

6. The method of claim 1, wherein the first gas mixture includes at least a gas $O_2$ or $NO_2$ gas.

7. The method of claim 1, wherein plasma oxidizing the back surface further comprises:
   cleaning the back surface of the substrate prior to plasma oxidizing the substrate.

8. The method of claim 1, wherein the oxidation layer has a thickness less than 150 Å.

9. The method of claim 1, further comprising:
   forming a back metal layer on the silicon nitride layer, wherein the back metal is selected from a group consisting of aluminum (Al), silver (Ag), tin (Sn), cobalt (Co), nickel (Ni), zinc (Zn), lead (Pb), tungsten (W), titanium (Ti) and/or tantalum (Ta) and nickel vanadium (NiV).

10. The method of claim 1, wherein the oxidation layer and the silicon nitrogen layer form a negatively charged passivation layer on the back surface of the substrate.

11. The method of claim 2, wherein the first gas mixture includes an oxygen gas or $NO_2$ gas.

12. The method of claim 2, wherein forming the negatively charged dielectric layer further comprises:
   cleaning the back surface of the substrate prior to forming the negatively charged dielectric layer.

13. The method of claim 12, wherein cleaning comprises cleaning the back surface of the substrate with hydrogen fluoride or hydrofluoric acid.

14. The method of claim 11, wherein the p-type of doping atom is boron.

15. The method of claim 2, wherein the n-type of doping atom is phosphate.

16. The method of claim 2, further comprising:
   depositing an ARC layer on the front surface, wherein the ARC layer comprises silicon nitride (SiN).

17. The method of claim 3, wherein the first gas mixture includes oxygen gas or $NO_2$ gas.

18. The method of claim 3, wherein the oxidation layer and the silicon nitride layer are formed in a decoupled plasma chamber.

19. The method of claim 18, wherein the oxidation layer and the silicon nitride layer form a negatively charged passivation layer.

\* \* \* \* \*

UNITED STATES PATENT AND TRADEMARK OFFICE
CERTIFICATE OF CORRECTION

PATENT NO.      : 8,168,462 B2
APPLICATION NO. : 12/479139
DATED           : May 1, 2012
INVENTOR(S)     : Borden et al.

It is certified that error appears in the above-identified patent and that said Letters Patent is hereby corrected as shown below:

In the Detailed Description:

Column 7, Line 22, please delete "152" and insert --452-- therefor;

Column 7, Line 23, please delete "150" and insert --450-- therefor;

In the Claims:

Column 14, Claim 14, Line 21, please delete "11" and insert --2-- therefor.

Signed and Sealed this
Fourteenth Day of August, 2012

David J. Kappos
*Director of the United States Patent and Trademark Office*